United States Patent
Kempsey

[19]

[11] Patent Number: 6,163,865
[45] Date of Patent: Dec. 19, 2000

[54] BUILT-IN SELF-TEST CIRCUIT FOR READ CHANNEL DEVICE

[75] Inventor: Patrick Wallace Kempsey, Catasauqua, Pa.

[73] Assignee: Lucent Technologies, Inc., Murray Hill, N.J.

[21] Appl. No.: 09/120,396

[22] Filed: Jul. 22, 1998

[51] Int. Cl.⁷ .................................................. G01R 31/28
[52] U.S. Cl. ............................................................ 714/733
[58] Field of Search ................................................ 714/733

[56] References Cited

U.S. PATENT DOCUMENTS

| | | | |
|---|---|---|---|
| 4,536,706 | 8/1985 | Kemper | 324/117 R |
| 4,543,654 | 9/1985 | Jones | 370/445 |
| 5,533,032 | 7/1996 | Johnson | 714/733 |
| 5,570,374 | 10/1996 | Yau et al. | 714/733 |
| 5,574,733 | 11/1996 | Kim | 714/728 |
| 5,640,509 | 6/1997 | Balmer et al. | 714/42 |
| 5,680,543 | 10/1997 | Bhawmik | 714/30 |

OTHER PUBLICATIONS

Lee, et al., (Design, Implementation and Performance Evaluation of an MDFE Read Channel. IEEE, 1998.

*Primary Examiner*—Albert De Cady
*Assistant Examiner*—Guy Lamarre
*Attorney, Agent, or Firm*—Wendy W. Koba, Esq.

[57] ABSTRACT

A BIST circuit for use with a read channel device is disclosed that utilizes internally generated clock and control signals to control a test sequence. A linear feedback shift register is used as the signature analysis register. The test signature accumulation process is controlled by clock and control signals internal to the read channel device that are associated with the normal operation of the read channel device.

7 Claims, 5 Drawing Sheets

50

BUILT-IN SELF-TEST CIRCUIT FOR READ CHANNEL DEVICE

BACKGROUND OF THE INVENTION

The present invention relates to a built-in self-test (BIST) circuit for a read channel device and, more particularly, to a BIST circuit that utilizes clock and control signals internal to the read channel device to control a test signature accumulation process.

DESCRIPTION OF THE PRIOR ART

Built-in self-test (BIST) circuitry has been incorporated within integrated circuits, circuit boards and entire systems to facilitate testing without the need for complex external test equipment. The presence of such BIST circuitry allows for the host incorporating such circuitry to internally generate its own test vectors and to internally observe its own response signals to such vectors. In a single-clock circuit environment, BIST circuitry is generally straightforward. However, some systems have multiple clock regimes, or include asynchronous environments. Accomplishing BIST in such arrangements has been difficult and may result in incorrect test data. For instance, clocking a clock regime of a BIST circuit within a system at a rate higher than its maximum rate can distort or corrupt the BIST data. Further, clocking the clock regime of a BIST circuit below its clock rate may not yield accurate test results.

One prior art approach to this problem is disclosed to U.S. Pat. No. 5,680,543, entitled "Method and Apparatus for Built-In Self-Test with Multiple Clock Circuits", issued to S. Bhawmik on Oct. 21, 1997 and assigned to the present assignee. In Bhawmik, a series of separate clock signals are generated and scheduled by a control circuit so that each separate module under test is clocked at its appropriate rate. Although this solution may be useful in situations where a known subset of clock rates are required and may be scheduled, a problem remains when desiring to provide for BIST in an asynchronous environment, such as found in standard read channel devices. The manner of BIST described here is useful on systems that derive their clock, timing recovery, and control signals from the inputs that they are processing.

SUMMARY OF THE INVENTION

The present invention relates to a built-in self-test (BIST) circuit for a read channel device and, more particularly, to a BIST circuit that utilizes clock and control signals internal to the read channel device to control a test signature accumulation process. This test signature accumulation process is designed to test either the "read" mode datapath or "write" mode datapath hardware of the read channel device.

In accordance with the present invention, a locally generated test (clock within a read channel device is used to start and stop a test signature accumulation process. Additionally, the signature accumulation register test clock has the same phase and frequency as the clock used to generate the signals being monitored. That is, the test clock is started and stopped with control signals derived from signals that the read channel device generates during normal operation. At the end of the test sequence, a test signature can be accessed from the device over a low-speed synchronous interface and compared to a known "good" signature.

BRIEF DESCRIPTION OF THE DRAWINGS

Referring now to the drawings.

DETAILED DESCRIPTION

Figure 1:
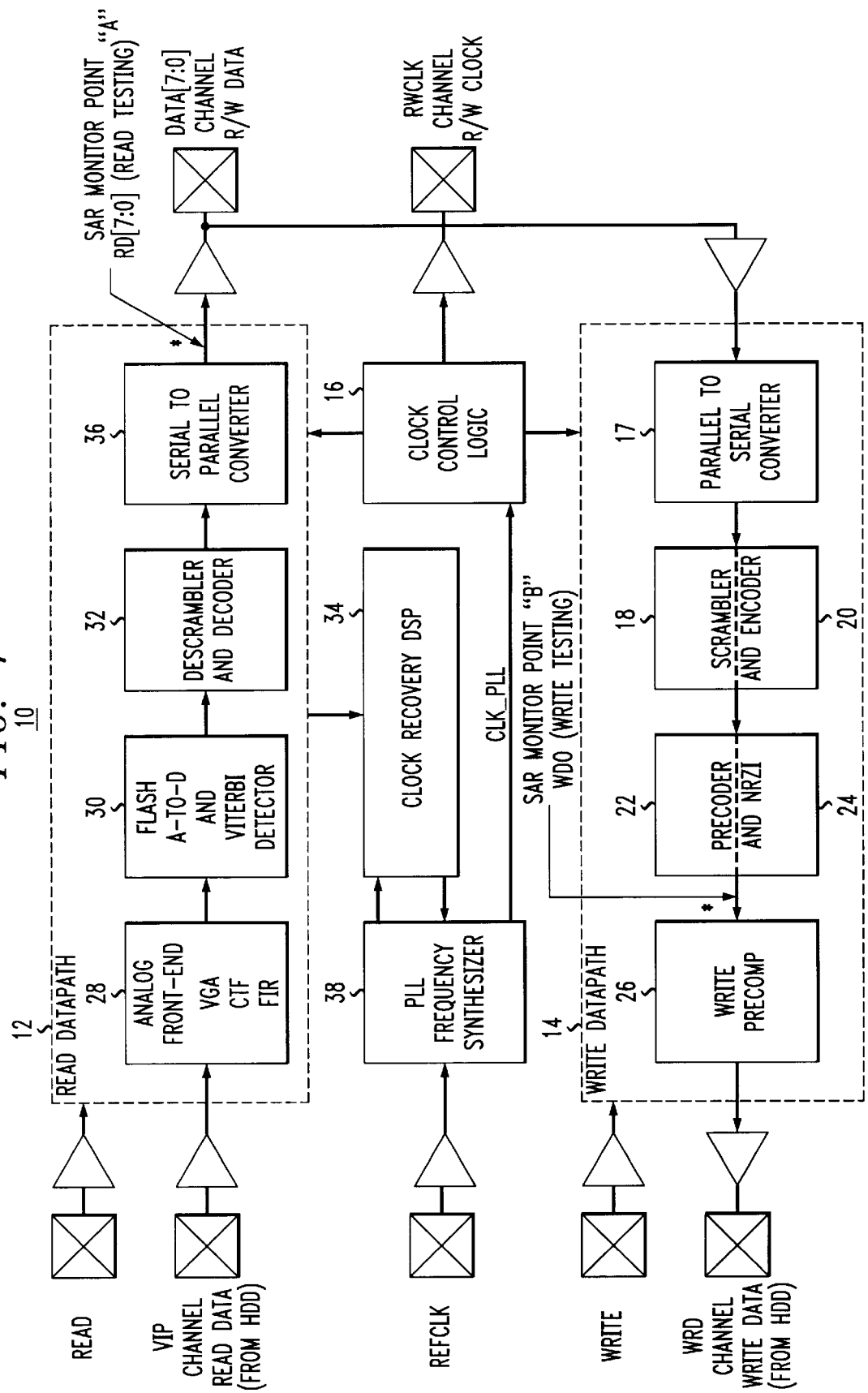
FIG. 1 contains a block diagram illustrating the read and write data paths and BIST monitor points on an exemplary read channel device.

A simplified block diagram of a read channel device 10 is illustrated in FIG. 1. The simplified diagram shows a READ datapath 12, a WRITE datapath 14, and a clocking arrangement 16 for controlling both datapaths. The operation of a read channel device in both the READ and WRITE modes will be briefly described in order to aid in the understanding of the BIST arrangement of the present invention. Referring to WRITE datapath 14, the data written to the media is first converted from a parallel to a serial data stream, represented by block 17 in FIG. 1. The serial data is then scrambled by summing the input data stream with a pseudo-random bit stream from a pseudo-random number generator 18, then encoded with a modulation encoder 20, as shown in FIG. 1. The encoded data stream is then passed through a precoder 22 and converted to NRZI format, represented by block 24 in FIG. 1. The encoded data stream is then precompensated (block 26) and written to a recording channel of a magnetic recording media, such as disk or tape. Encoding is employed to achieve high transition densities to allow frequency timing and gain control updates from the data stream when read back from the recording channel.

When the magnetic recording channel is read from the media by a head (illustrated READ datapath 12 in FIG. 1), the analog signal created by the head is processed by the analog front-end of the read datapath, represented by block 28 in FIG. 1. The signal is subsequently digitized and applied to a maximum likelihood sequence detector 30, such as a Veterbi detector, to reconstruct the modulation-coded encoded data signal. The reconstructed signal is then subjected to a decoding processes, for example, descrambling and modulation decoding, as shown in block 32 of FIG. 1. Again, timing and control information is recovered from the read-back signal and applied as an input to clock recovery DSP 34 of clocking arrangement 16. The decoded read data stream is ultimately converted from a serial stream to an 8-bit wide parallel data stream (referred to as RD[7:0]) in a serial to parallel converter 36. The entire read channel device 10 is clocked from a resident phase-locked-loop frequency synthesizer (PLL) 38. Typically, in PLL-based systems such as read channel device 10 (or other communication channels), the clocking frequency of the digital logic internal to the device is significantly greater than the frequencies of the signals seen at the input or output of the device.

Figure 2:
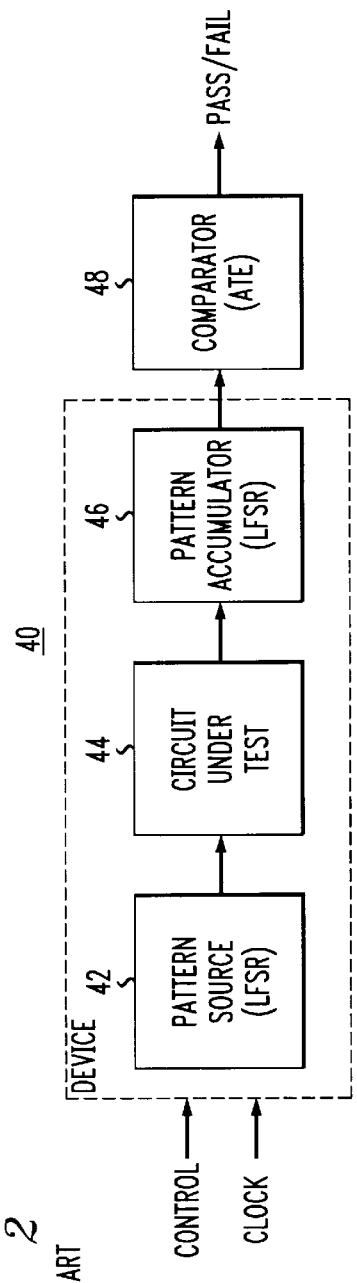
FIG. 2 is a simplified prior art diagram illustrating a conventional BIST scheme using linear feedback shift registers.

A conventional BIST scheme 40 known in the prior art is illustrated in FIG. 2. As shown, BIST scheme 40 generates a pseudorandom test sequence using a first linear feedback shift register (LFSR) 42. The initiation of LFSR 42 is under the control of an external clock signal, as shown. The test sequence pattern is thereafter applied as the input to the circuit being tested, designated as circuit 44 in FIG. 2. A second linear feedback shift register, denoted LFSR 46, is used to collect and compress the output from circuit 44. Both shift registers 42 and 46 are built into the larger circuit module and the generation and collection of results is performed at the circuit clock rate. Upon completion of the test sequence, the output from LFSR 46 is transmitted to a comparator 48 (contained in external test hardware) that functions to compare this test output sequence to a known "good" control output for the type of circuit being tested.

In accordance with the teachings of the present invention, this prior art BIST architecture can be modified so as to provide for self-testing of the read/write datapaths discussed above in associated with FIG. 1. Advantageously, a BIST arrangement in accordance with the present invention utilizes the pre-existing datapath processing logic as a pattern generator and PLL 38 to control the BIST functions. In particular, for performing a BIST on READ datapath 12, the bit stream at point A in FIG. 1 is used as the exemplary test pattern input. For performing a BIST on WRITE datapath 14, the bit stream at point B is used as the test pattern input. In both cases, the data generated by normal datapath operations substitutes for the initial LFSR in the conventional BIST architecture. The high frequency PLL 38 is used as an internal clock to control the pattern accumulator, also referred to as a signature analysis register.

Figure 3:
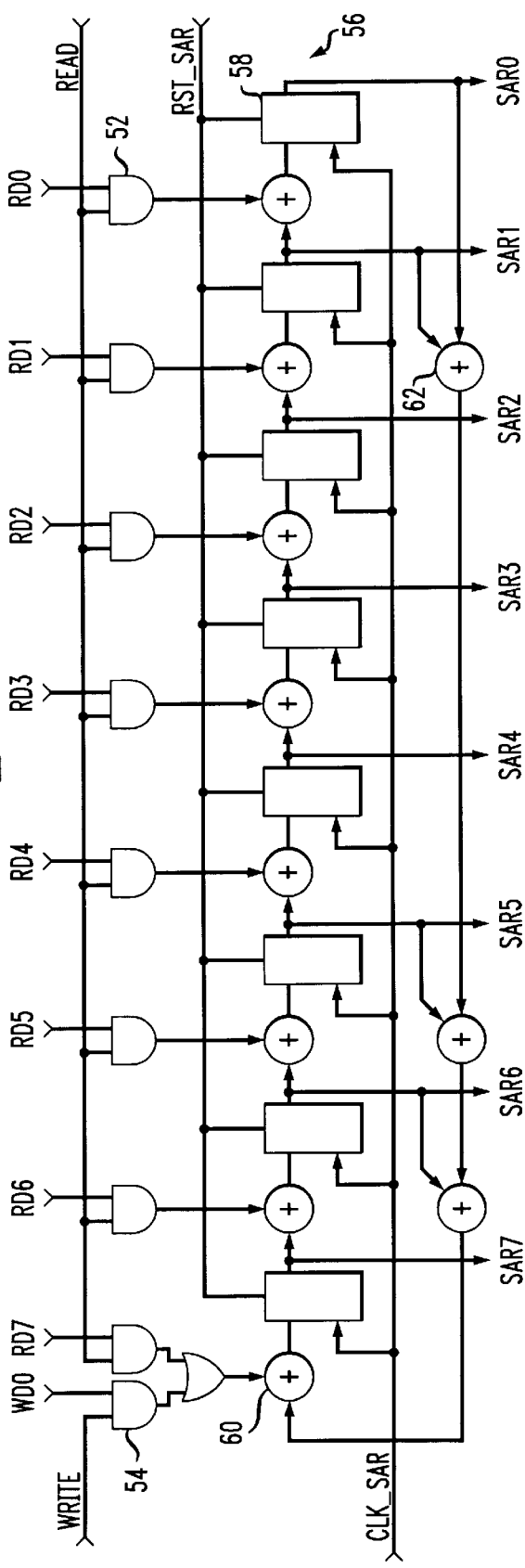
FIG. 3 illustrates a signature analysis register, controlled by CLK_SAR, for accumulating test signatures from the READ or WRITE data streams in a read channel device in accordance with the present invention.

An exemplary signature analysis register (SAR) 50 for use with the BIST arrangement of the present invention is illustrated in FIG. 3. As shown, the 8-bit output from Point A in READ datapath 12, denoted RD0–RD7 is applied as separate inputs to a first set of AND gates 52. The one-bit WRITE datapath output from point B, denoted WD0, is applied as an input to logic circuit 54. The read/write outputs from these logic gates are applied as inputs to a linear feedback shift register (LFSR) 56., which comprises a set of D flip-flops 58 and adders 60 used to collect and compress the lest pattern output from READ and WRITE datapaths 12,14. As will be described below Ln association with the timing diagrams of FIGS. 4 and 5, LFSR 56 is reset, as required, by an input signal RST_SAR and, in accordance with the present invention, each stage in the shift register is clocked by the same internal clock, defined as CLK_SAR (where as described above, CLK_SAR is derived from the internal clocking of PLL 38). The arrangement of SAR 50 includes an additional set of adders 62 so as to implement a primitive polynomial H(x). An exemplary primitive that may be implemented is the polynomial $H(x)=x^8+x^6+x^5+x^1+x^0$, as discussed in the article entitled "Pseudo-Random Sequences and Arrays" by F. J. MacWilliams et al., appearing in *Proceedings of the IEEE* Vol. 64, No. 12, December 1976 at p. 1715 et seq. As discussed by MacWilliams et al., this particular primitive exhibits a likelihood of error detection of approximately 99.6%. The output from SAR 50 is therefore the eight-bit output from flip-flops 58, denoted SAR[7:0] in FIG. 3. Thereafter, this output signal is compared against a known "good" response in an external comparator circuit (not shown) to complete the testing of read channel device 10 (in either the READ or WRITE mode).

Figure 4:
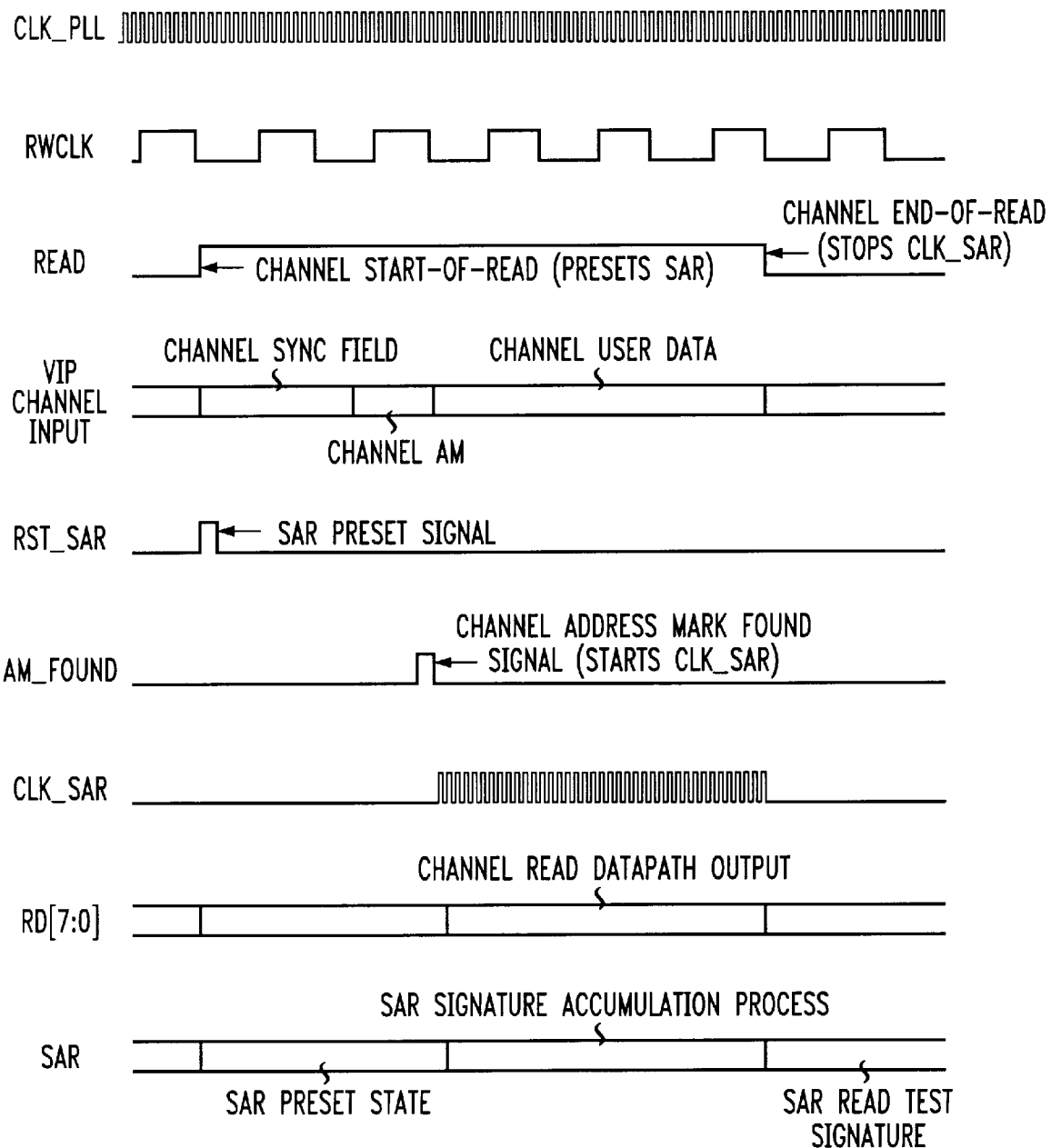
FIG. 4 is a timing diagram associated with the signature analysis register of FIG. 3 when performing test signature analysis on the READ data stream.

A set of timing diagrams associated with the operation of SAR 50 in the READ mode is shown in FIG. 4. In operation, the signal "READ" is first asserted and this transition is used to generate the SAR preset signal, RST_SAR (initializing flip-flops 56 in SAR 50). The read data is then processed until a "channel address mark" is detected. The channel address mark, labeled AM_FOUND in FIG. 4, is then used to initiate the SAR clock signal, defined as CLK_SAR. Once initiated, CLK_SAR will follow, as shown in the timing diagram of FIG. 4, the clocking signal of CLK_PLL, the internally generated phase-locked loop clock signal. Advantageously, therefore, the BIST arrangement of the present invention is capable of operating at a much faster rate than prior art BIST arrangements that relied on an externally applied, much slower, reference clock.

Referring back to the process, SAR 50 will accumulate signature data based on the current state of the register and the incoming read data RD0–RD7. The end of the READ cycle turns "off" CLK_PLL, ending the accumulation of the signature data. The accumulated data, which has been compressed into a single 8-bit word, is then read out (over a low speed synchronous interface) and applied as an input to an external comparator that performs the requisite analysis (i.e., comparison of the accumulated signature to a known "good" result) to complete the testing of the read channel device.

Figure 5:
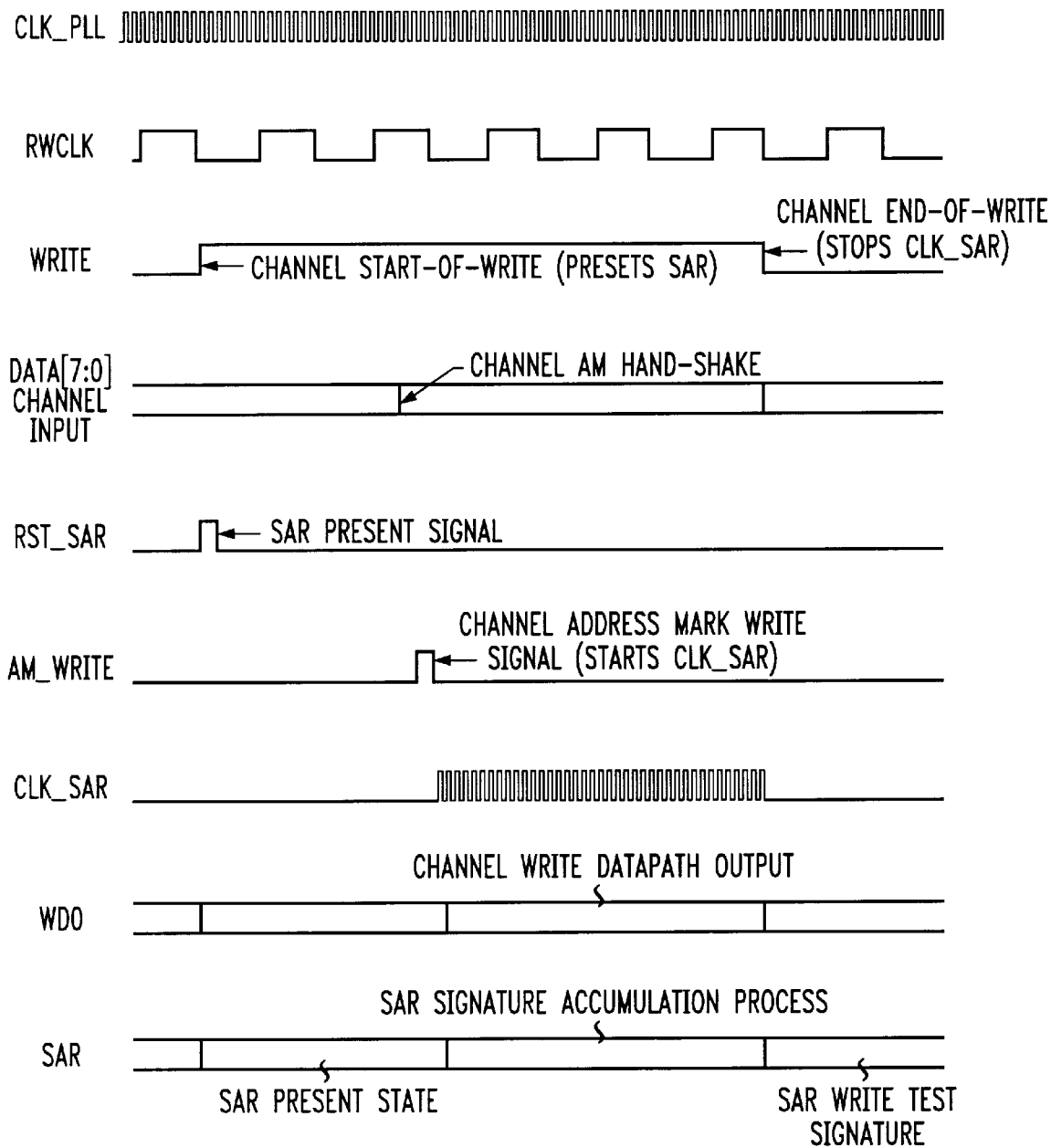
FIG. 5 is a timing diagram associated with the signature analysis register of FIG. 3 when performing test signature analysis on the WRITE data stream.

FIG. 5 contains the timing diagrams associated with the utilization of the BIST arrangement of the present invention to test the WRTE performance of read channel device 10. Referring to FIG. 5, the WRITE signal is first asserted and functions to generate a SAR reset pulse (RST_SAR) to initialize flip-flops 56. A channel address mark handshake received from channel R/W data interface is used to generate a channel address mark write signal (AM_WRITE) which is used to initiate CLK_SAR during the WRITE mode. The write data is accumulated in LFSR 56 until the WRITE signal goes low, where this transition is used to stop CLK_SAR. The WRITE data output will be available at SAR0–SAR7 and subsequently sent through a low speed synchronous interface to an off-circuit comparator for testing against a known "good" result.

Figure 6:
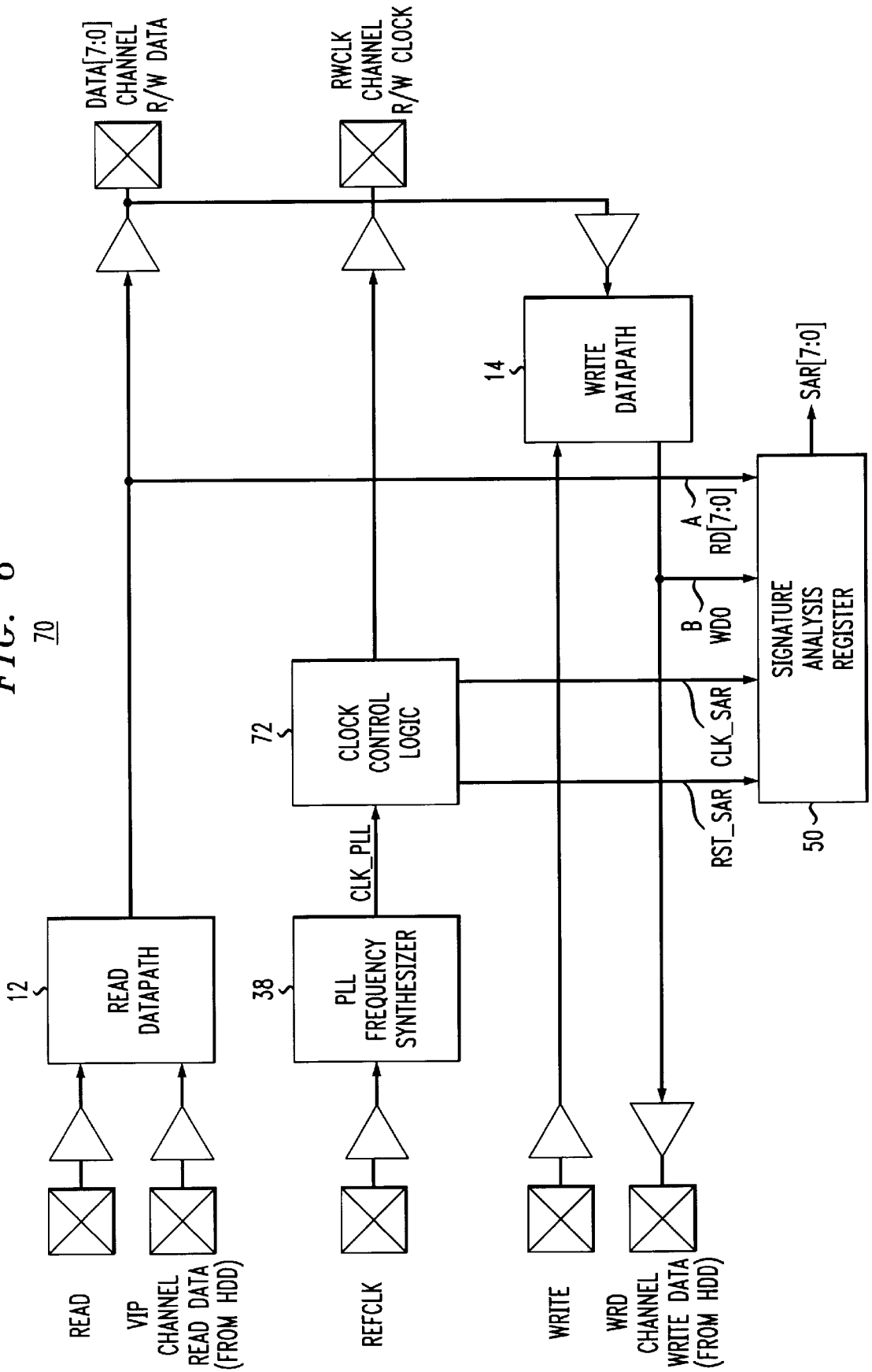
FIG. 6 is a simplified block diagram of a read channel device incorporating the BIST arrangement of the present invention.

A simplified block diagram of an exemplary read channel device 70 including the BIST structure of the present invention is illustrated in FIG. 6. READ datapath 12 and WRITE datapath 14 are as shown in FIG. 1. As shown in FIG. 6, the READ output at Point A is used as the RD[7:0] input to SAR 50. The WRITE output at Point B is used as WD0 input to SAR 50. The reference clock input (REFCLK) to read channel device 70 is used to generate CLK_PLL, using PLL frequency synthesizer 38. Clock control logic 72 uses CLK_PLL, in combination with the known READ and WRITE signal transitions, to generate the SAR "reset" and "clock" signals, denoted RST_SAR and CLK_SAR, respectively. It is to be understood that the above-described embodiments are merely illustrative of the principles of the present invention. Various modifications and changes may be made thereto by those skilled in the art which will embody the principles of the present invention and fall within the spirit and scope thereof

What is claimed is:

1. A read channel device including a built-in self-test circuit, said device comprising
    a read datapath for retrieving information stored on a medium and transforming said information into a first digital data stream;
    a write datapath responsive to a second digital data stream and transforming said second digital data stream into analog information to be stored on a medium;
    a phase-locked loop, responsive to a reference clock, for generating an internal, high speed clocking signal for controlling the read and write datapaths; and the built-in self-test circuit comprising:

a signature analysis register, responsive to said first and second digital data streams from the read and write datapaths, respectively, said signature analysis register turned "on" and "off" by the presence of either one of said first and second digital data streams and clocked by the phase-locked loop, said signature analysis register for compressing and storing either one of said first and second digital data streams when turned "on" and transmitting the compressed data to an off-circuit comparator when turned "off".

2. The read channel device as defined in claim 1 wherein the signature analysis register comprises a linear feedback shift register.

3. The read channel device as defined in claim 2 wherein the linear feedback shift register implements a predefined primitive H(x).

4. The read channel device as defined in claim 3 wherein $H(x)=x^8-x^6+x^5+x^1+1$.

5. The read channel device as defined in claim 1 wherein the device further comprises clock control means responsive to the phase-locked loop and the read and write datapath first and second digital streams, said clock control means for generating a reset signal applied as an input to the signature analysis register for initializing the signature analysis register prior to initiating a test sequence.

6. The read channel device as defined in claim 5 wherein the clock control means recognizes a channel address mark in the read and write first and second digital data streams and turns "on" the signature analysis register in response to said channel address mark.

7. The read channel device as defined in claim 5 wherein the clock control means recognizes a channel end mark in either one of the read and write first and second digital data streams, indicating said digital data stream going inactive, and turns "off" the signature analysis register in response to said channel end mark.

\* \* \* \* \*